United States Patent
Lee

(10) Patent No.: US 7,898,355 B2
(45) Date of Patent: Mar. 1, 2011

(54) FLAT UNIFORM TRANSMISSION LINE HAVING ELECTROMAGNETIC SHIELDING FUNCTION

(75) Inventor: Joo-Yeol Lee, Gunpo-si (KR)

(73) Assignee: Brocoli Ltd., Suwon-Si, Gyeonggi-Do (KR)

( * ) Notice: Subject to any disclaimer, the term of this patent is extended or adjusted under 35 U.S.C. 154(b) by 170 days.

(21) Appl. No.: 12/103,460

(22) Filed: Apr. 15, 2008

(65) Prior Publication Data

US 2009/0021323 A1 Jan. 22, 2009

(30) Foreign Application Priority Data

Jul. 19, 2007 (KR) ........................ 10-2007-0072113

(51) Int. Cl.
*H01P 5/00* (2006.01)
*H01P 3/08* (2006.01)

(52) U.S. Cl. ............................ 333/1; 333/24 R; 333/238

(58) Field of Classification Search .............. 333/1, 236, 333/238, 24 R, 109, 111, 116
See application file for complete search history.

(56) References Cited

U.S. PATENT DOCUMENTS

| | | | | | |
|---|---|---|---|---|---|
| 4,045,750 | A | * | 8/1977 | Marshall | ........................ 333/100 |
| 4,626,889 | A | * | 12/1986 | Yamamoto et al. | ........... 257/773 |
| 6,040,524 | A | * | 3/2000 | Kobayashi et al. | .............. 174/36 |
| 6,611,181 | B2 | * | 8/2003 | Marketkar et al. | ........... 333/24 R |
| 6,625,682 | B1 | * | 9/2003 | Simon et al. | ................... 710/305 |
| 7,336,139 | B2 | * | 2/2008 | Blair et al. | .......................... 333/1 |
| 2004/0159460 | A1 | | 8/2004 | Passiopoulos et al. | |
| 2007/0040626 | A1 | | 2/2007 | Blair et al. | |

FOREIGN PATENT DOCUMENTS

| | | |
|---|---|---|
| EP | 1575062 A | 9/2005 |
| JP | 2003-188609 | 7/2003 |

OTHER PUBLICATIONS

European Search Report for European Patent Application No. 08012852.3 corresponding to U.S. Appl. No. 12/103,460, Oct. 2008.
Magerko M A et al: "Configuration Considerations for Multi-layered Packaged Conductor-backed Coplanar Waveguide MICs", Microwave Symposium Digest, 1994., IEEE MTT-S International San Diego, CA, USA May 23-27, 1994, New York, NY, USA, IEEE, May 23, 1994, pp. 1697-1700, XP010586343 ISBN: 978-0-7803-1778-9 p. 1697, left-hand column, line 9-line 44; figure 1.

* cited by examiner

*Primary Examiner* — Dean O Takaoka
(74) *Attorney, Agent, or Firm* — LRK Patent Law Firm

(57) ABSTRACT

Disclosed herein is a flat uniform transmission line having an electromagnetic shielding function. The flat uniform transmission line includes a strip transmission line, an insulating layer, and electromagnetic shielding layers. The strip transmission line is formed on a dielectric layer made of functional polymer material, and includes a plurality of strip lines. The plurality of strip lines are configured to be a ground line, or to transmit signals. The insulating layer is formed on the strip transmission line. The electromagnetic shielding layers are respectively formed on the insulating layer and beneath the strip transmission line.

11 Claims, 15 Drawing Sheets

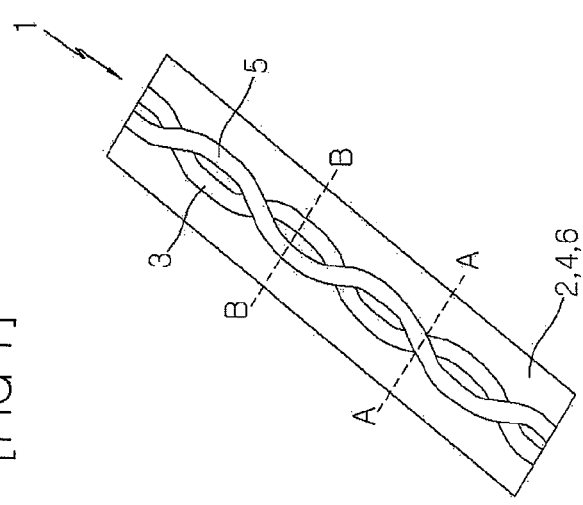
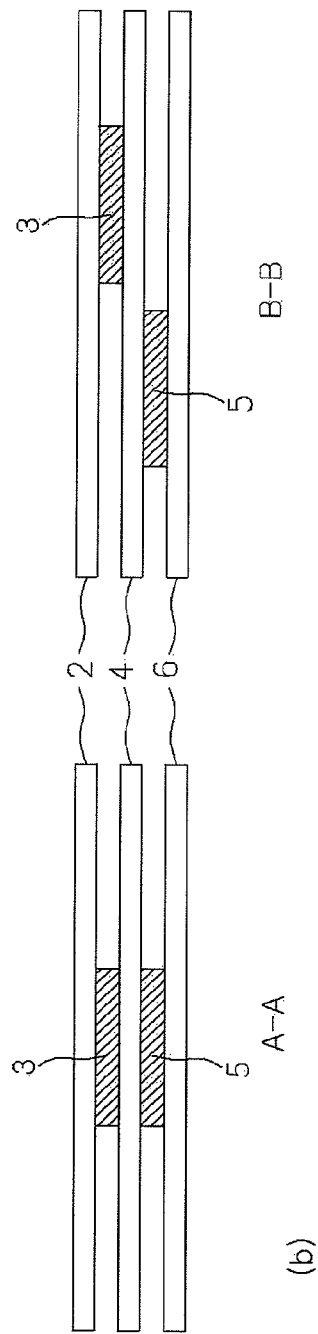

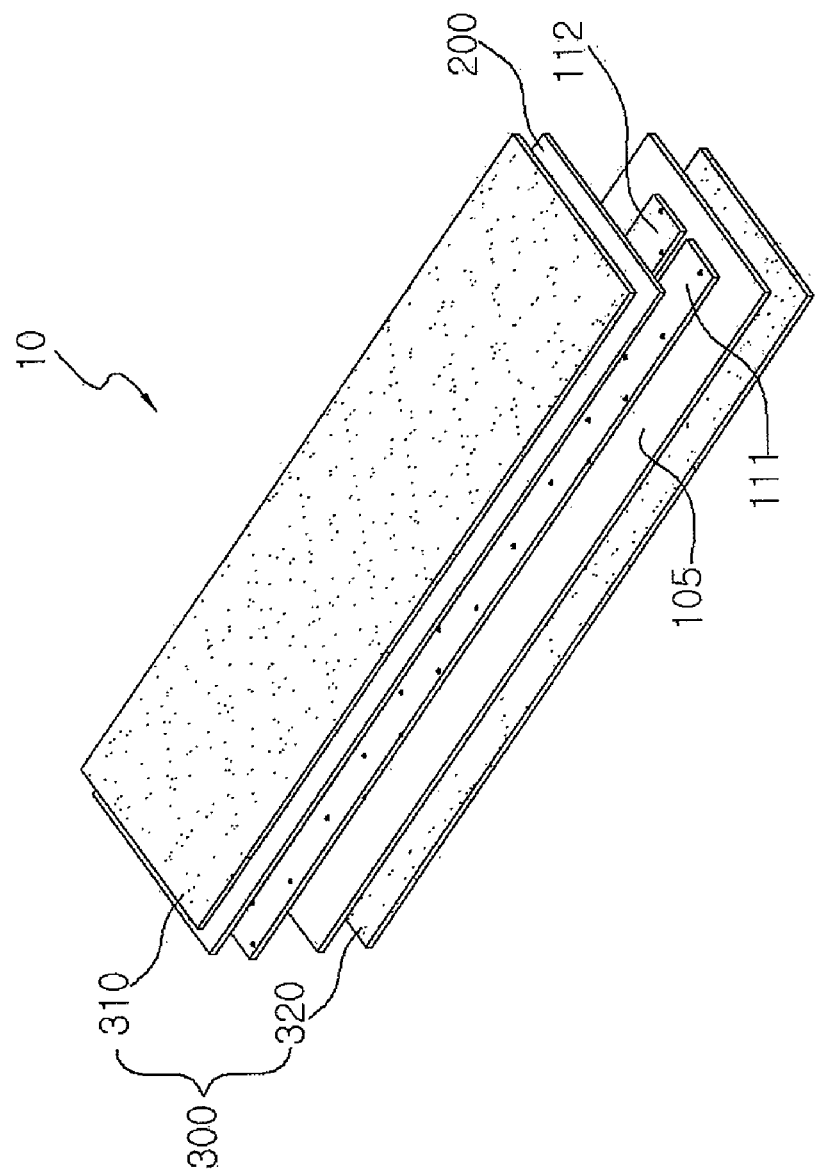
[FIG 2A]

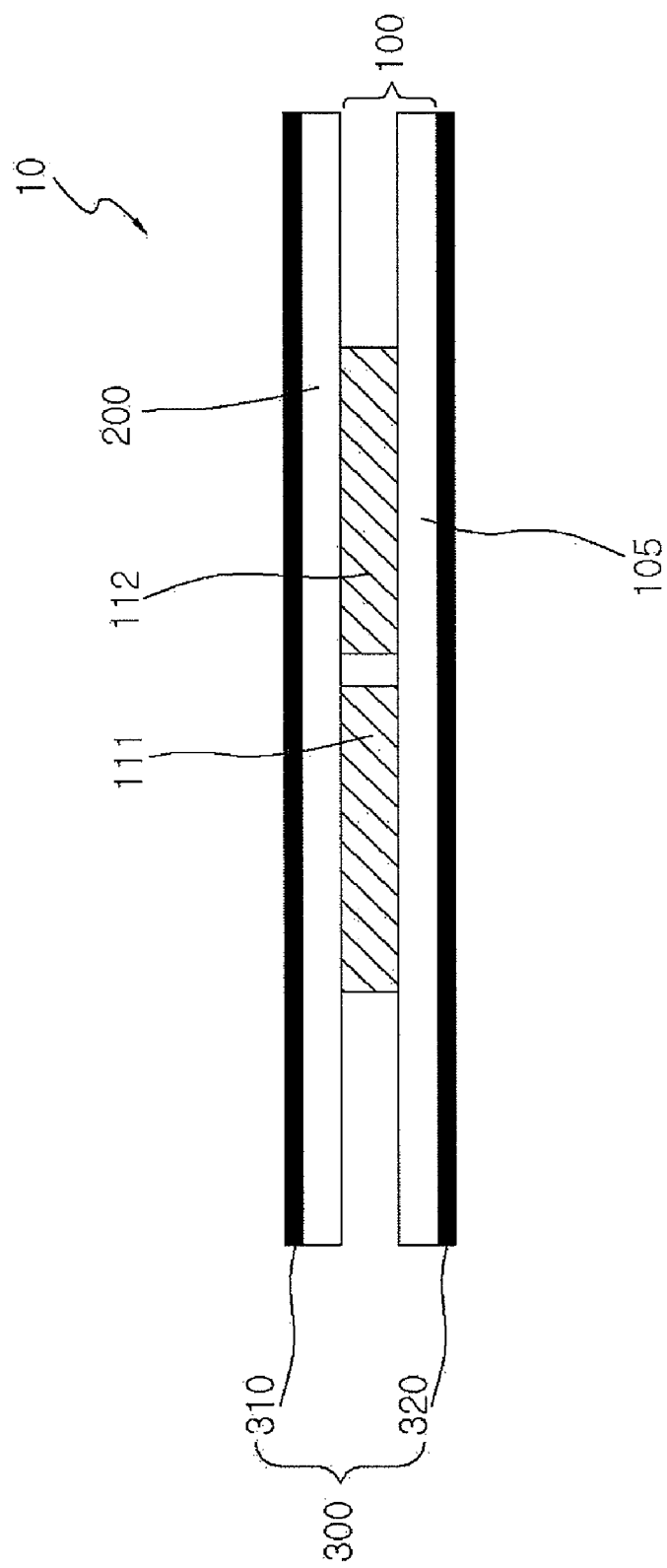

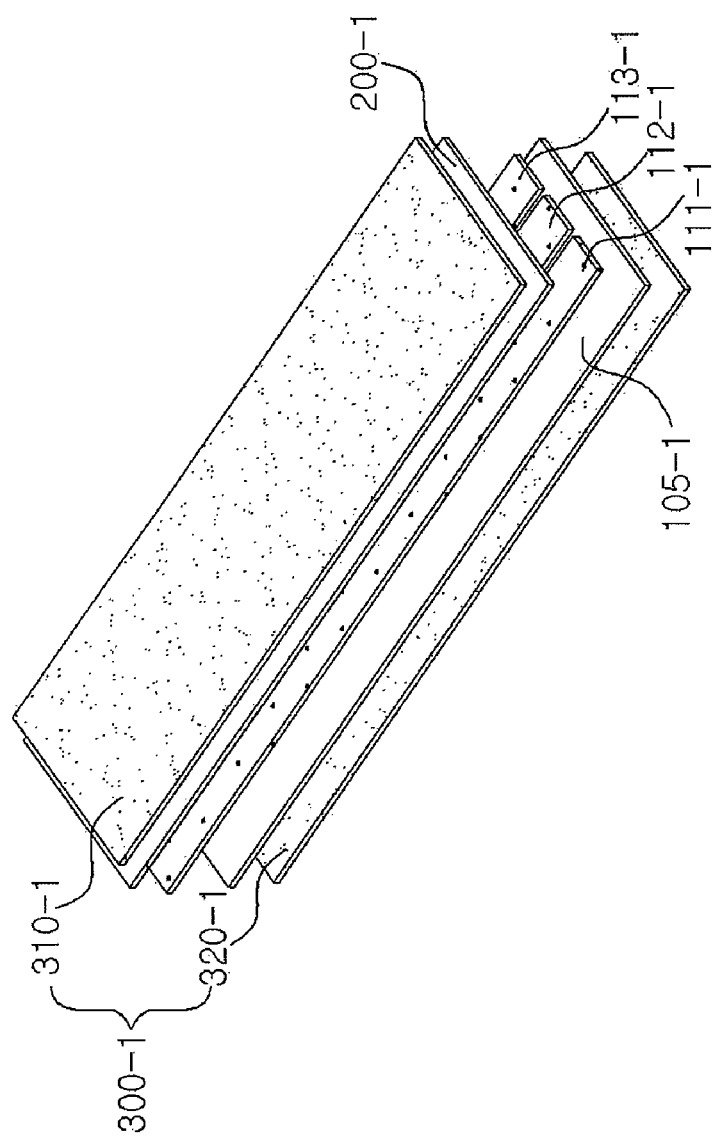
[FIG 3A]

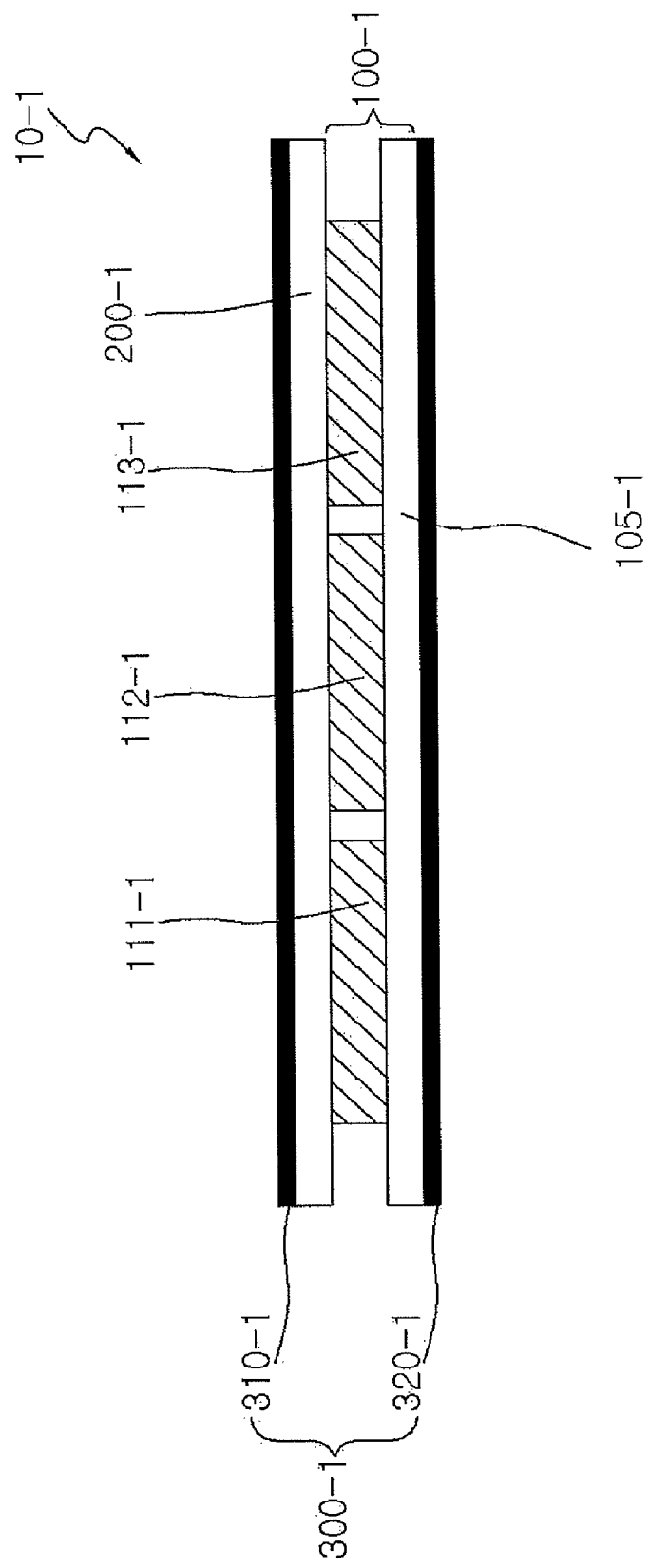

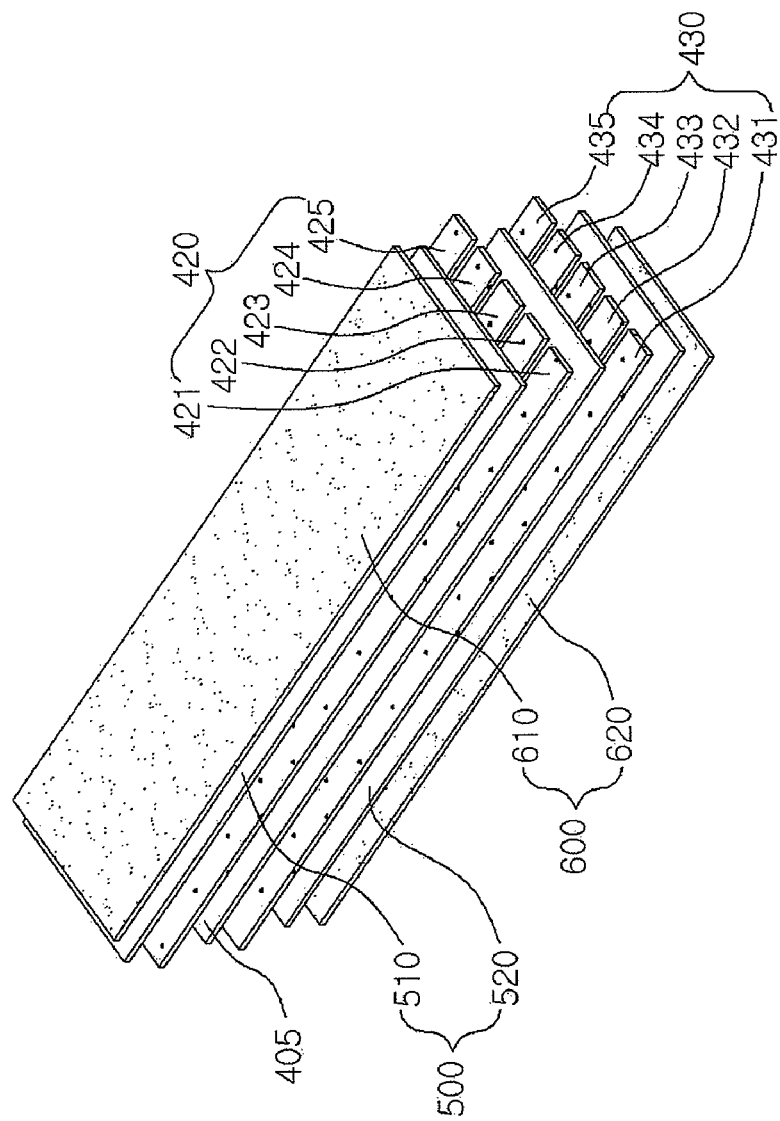
[FIG 4A]

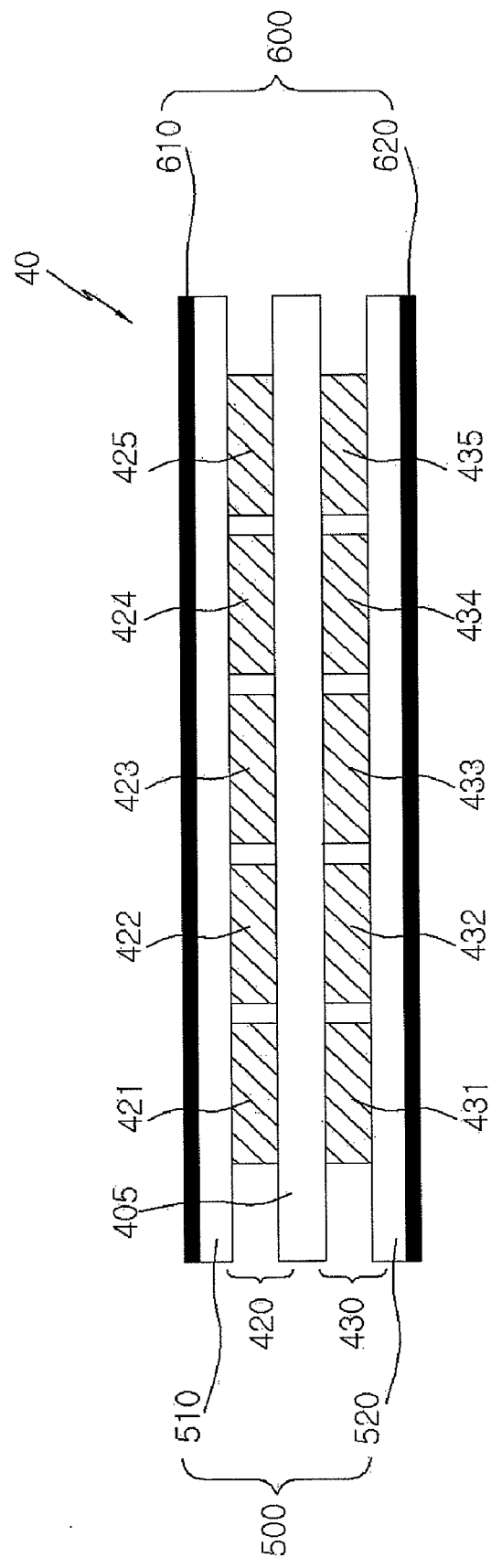
[FIG 4B]

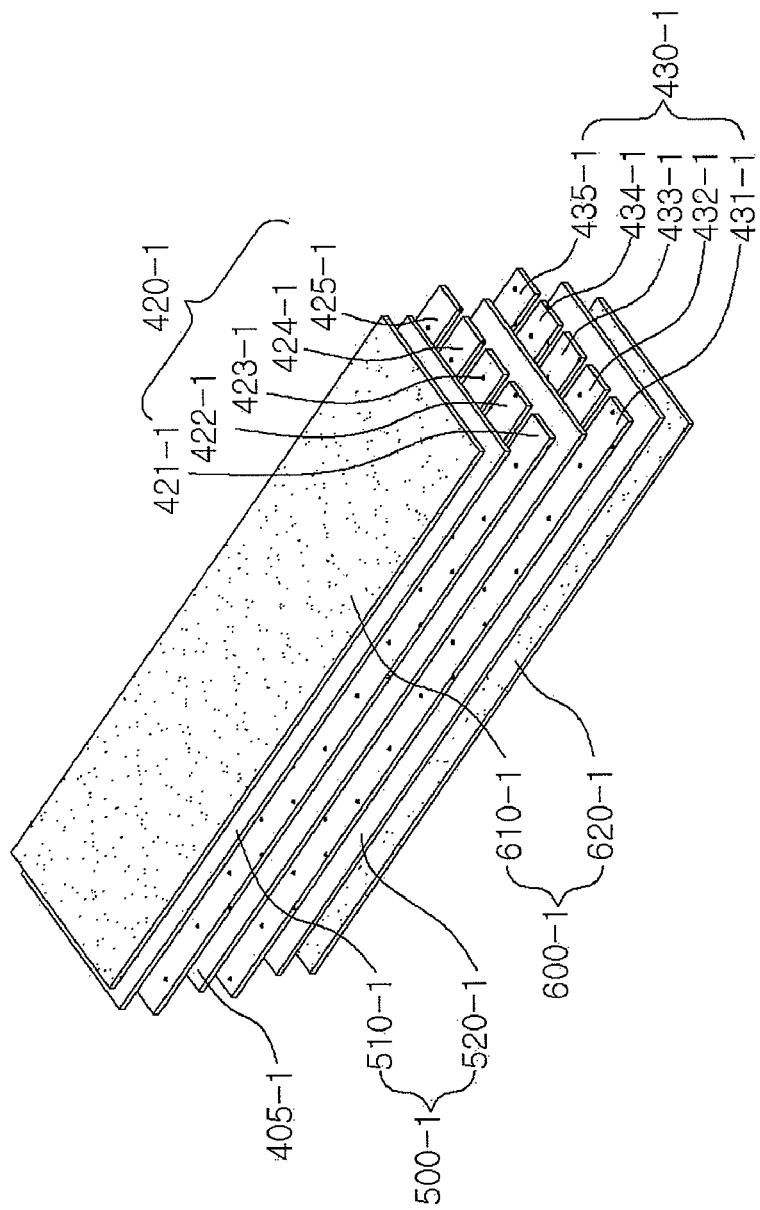

[FIG 5B]
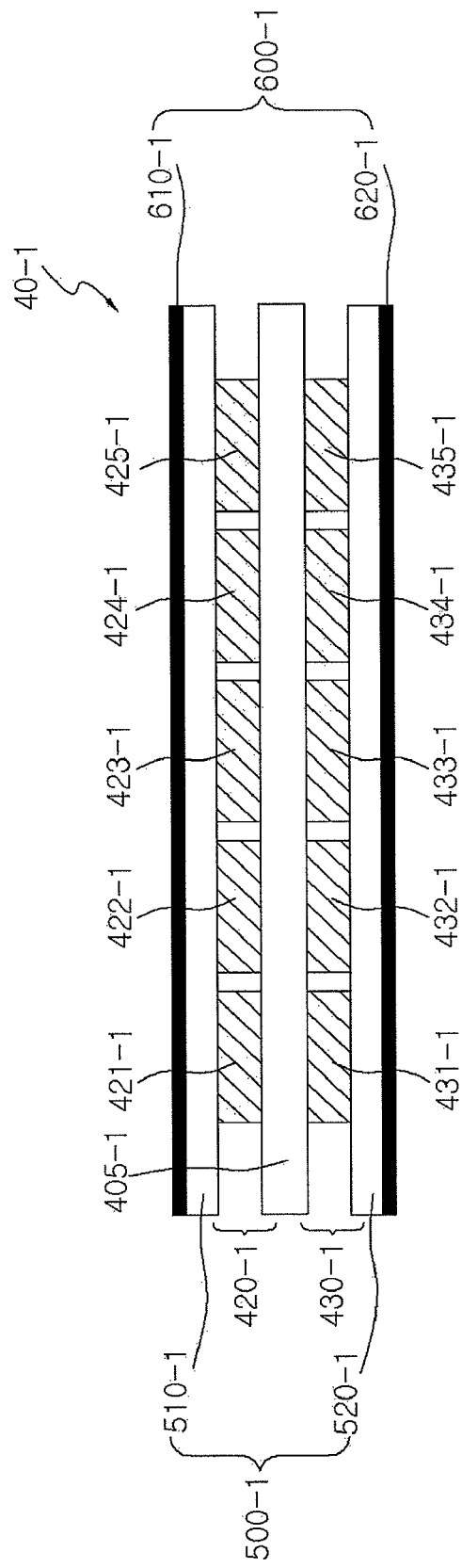

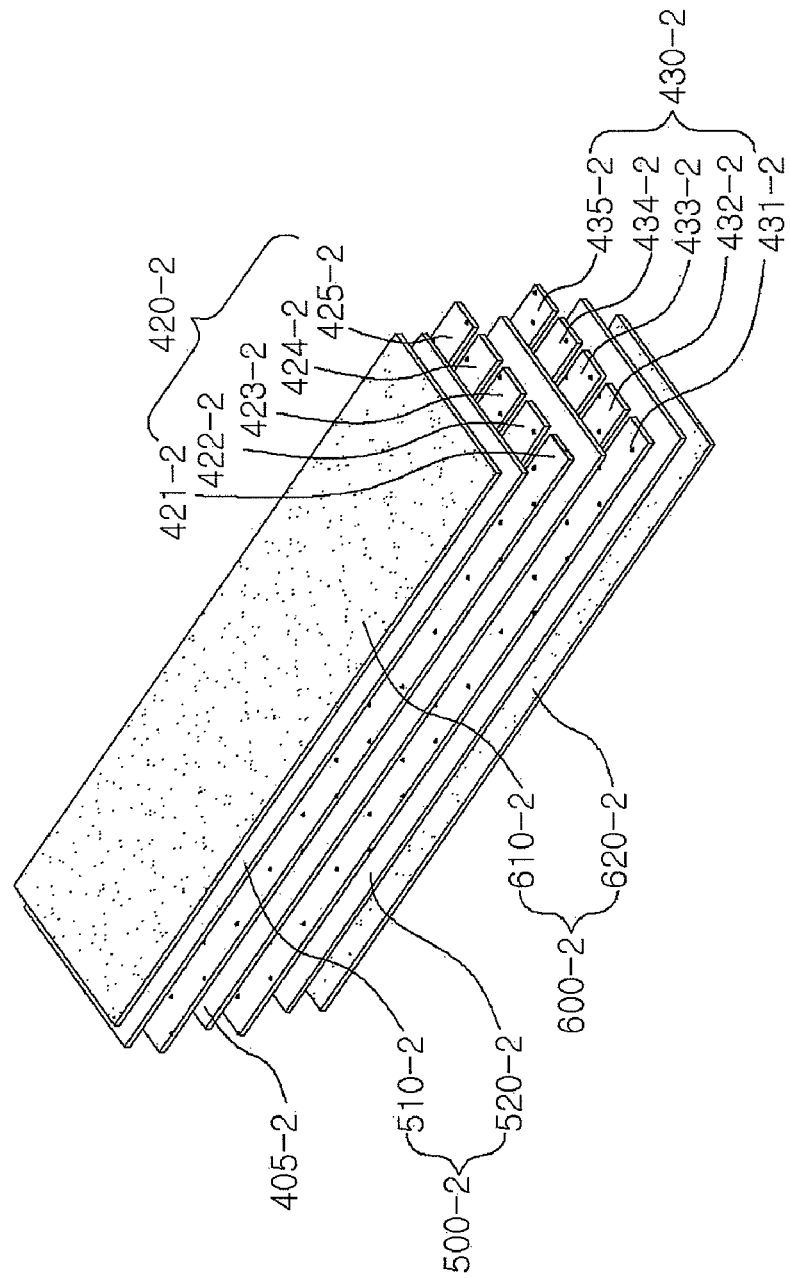

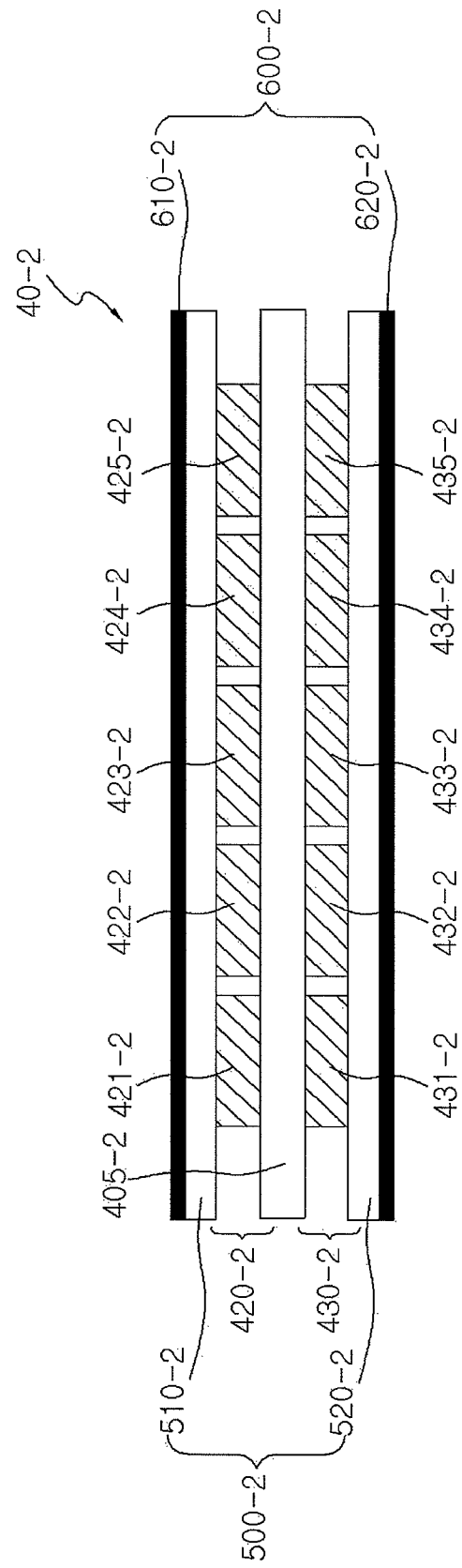

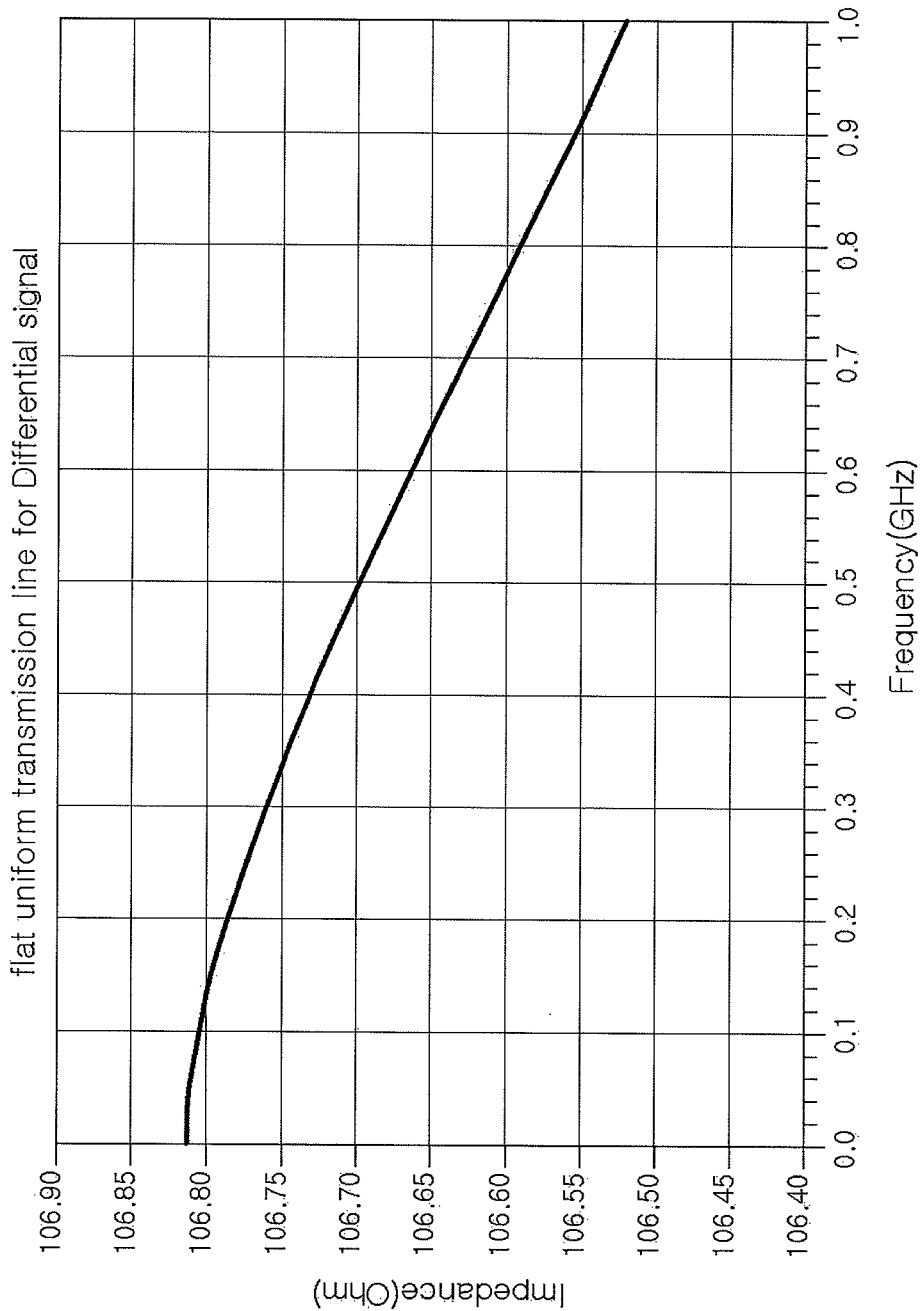

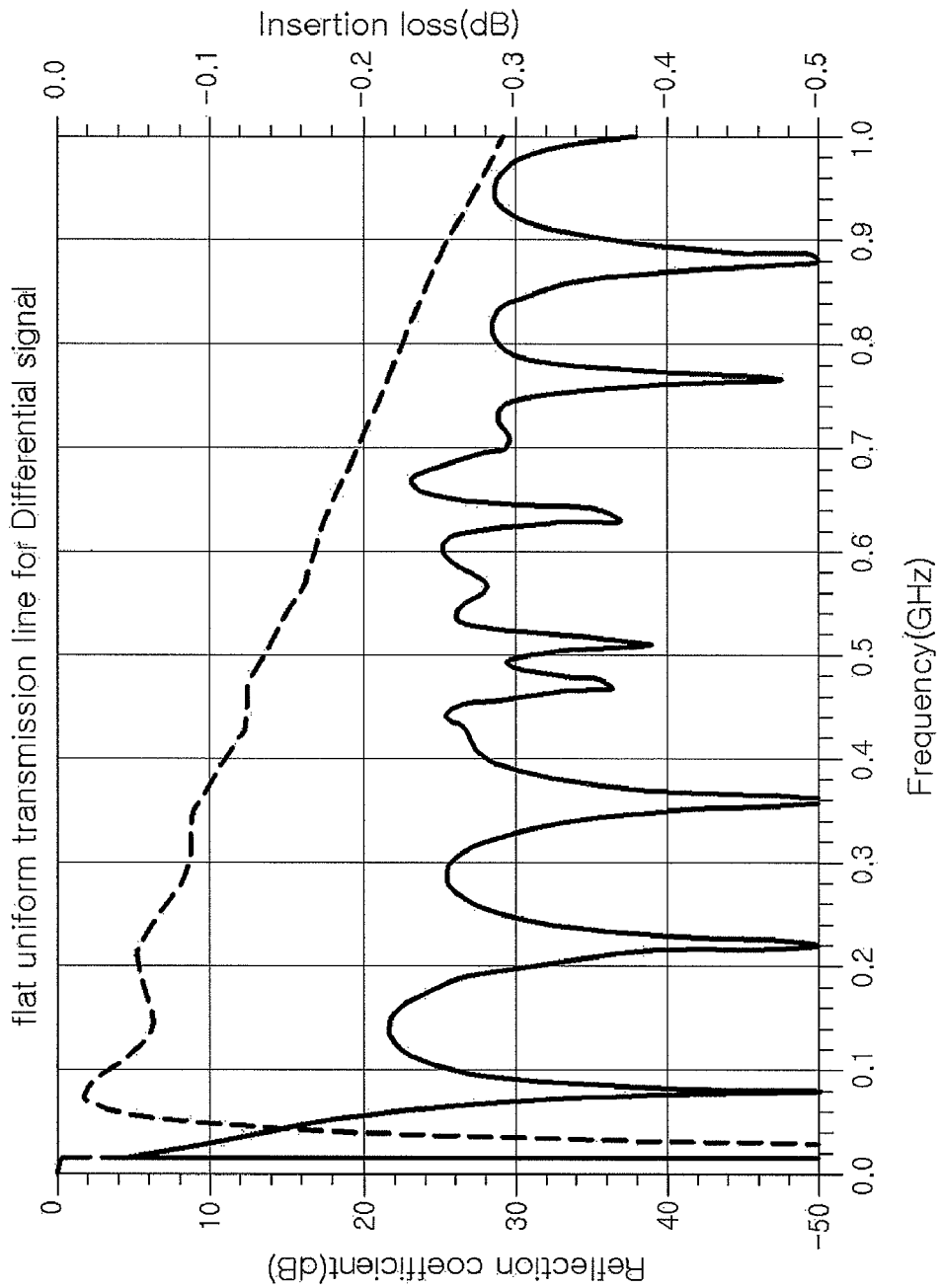

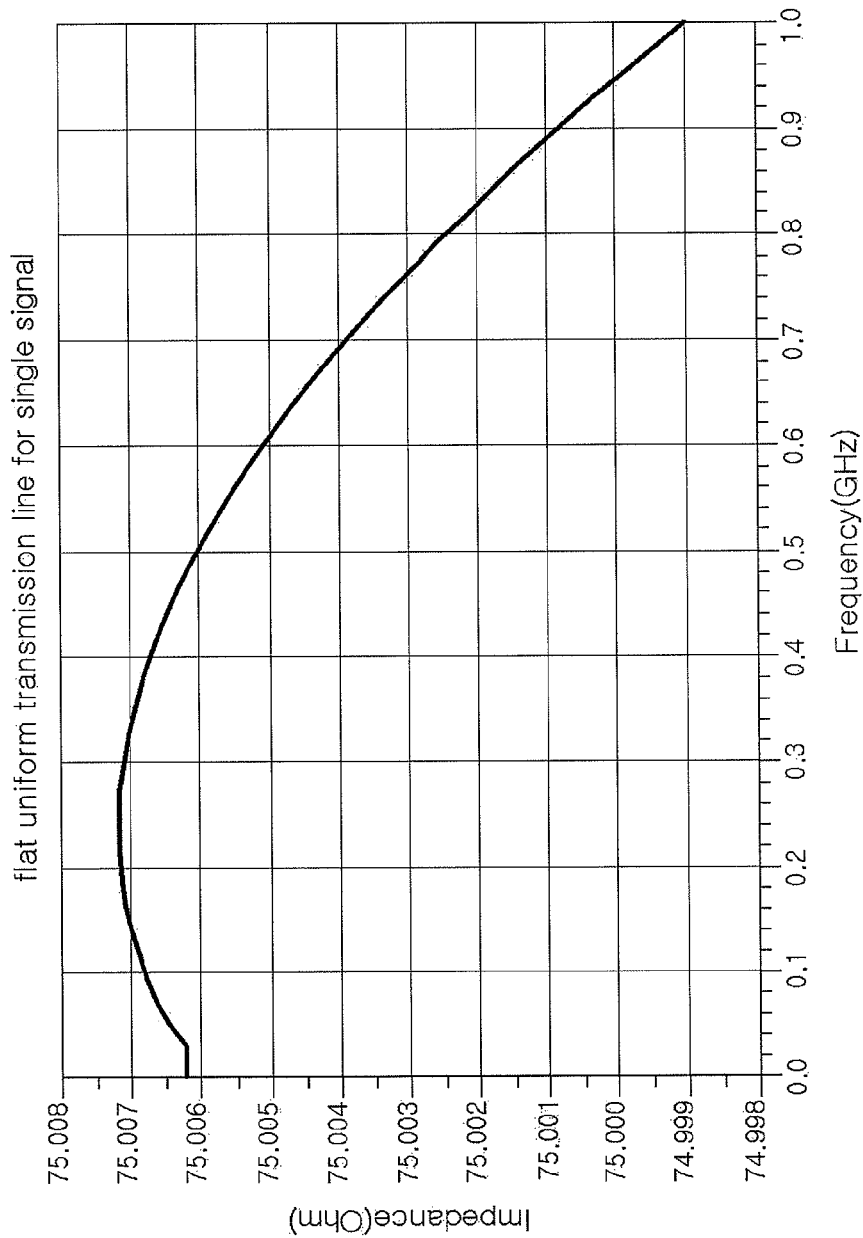
[FIG 9]

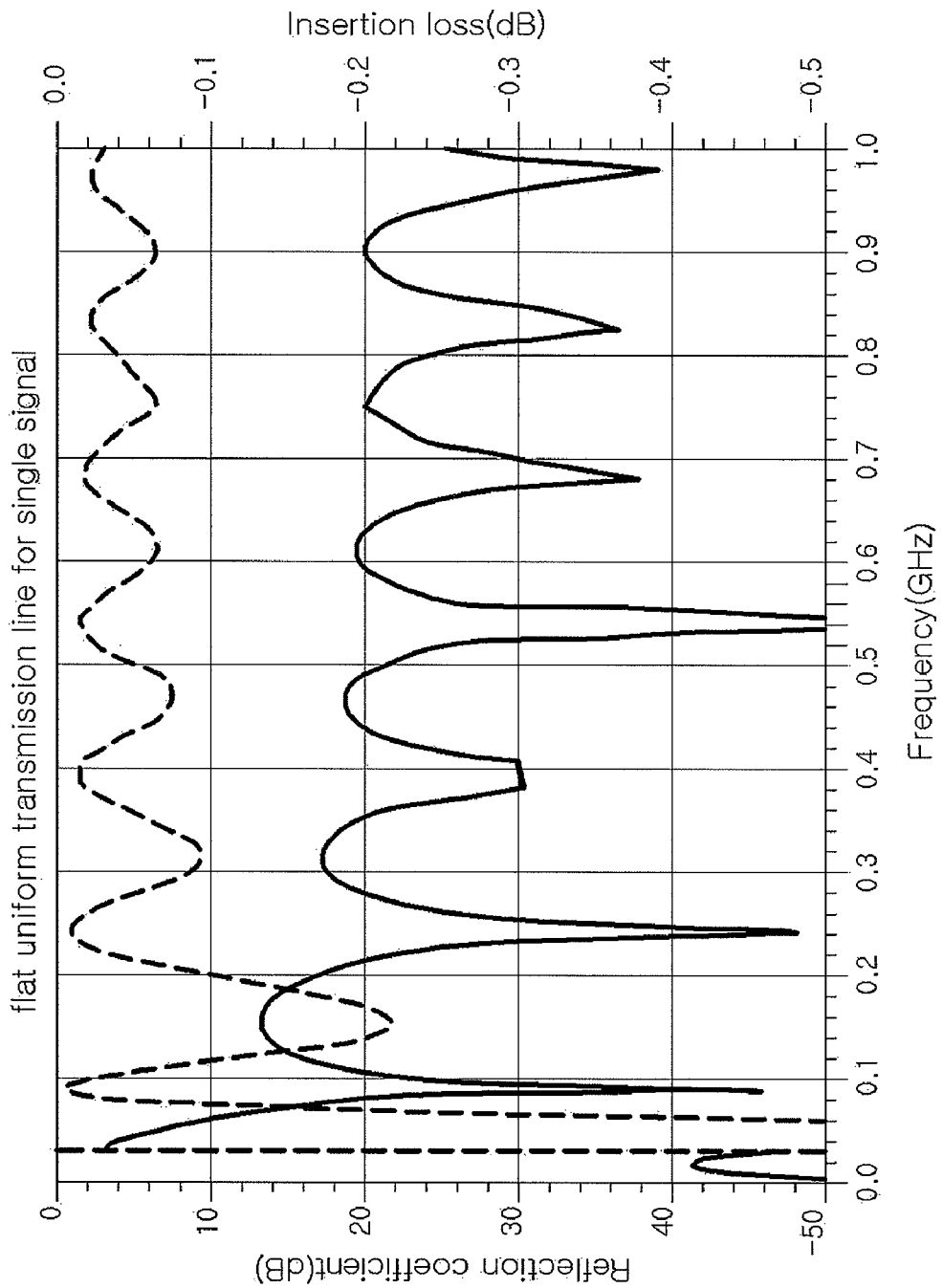

FLAT UNIFORM TRANSMISSION LINE HAVING ELECTROMAGNETIC SHIELDING FUNCTION

BACKGROUND OF THE INVENTION

1. Field of the Invention

The present invention relates to a flat uniform transmission line, in which a strip transmission line, an insulating layer and an electromagnetic shielding layer are formed in a stacked structure, thereby making a flat and uniform transmission line, so that it can be embedded in both indoor and outdoor floors in buildings and thus can be used instead of an existing power supply cable and an existing transmission cable, with the result that wiring between devices, which is becoming increasingly complicated, can be simply constructed.

2. Description of the Related Art

In regard to the prior art, in a non-uniform transmission line and a method of fabricating the same, which are shown in FIG. 1, a non-uniform flat transmission line 1 is provided, wherein transmission lines 3 and 5 are respectively disposed on and beneath a dielectric layer 4 in order to make the non-uniform flat transmission line 1 flat, and insulating layers 2 and 6 are respectively disposed on and beneath the transmission lines 3 and 5, thereby enabling it to maintain its function over long-distances, which is the characteristic of a twisted-pair cable (U.S. Pat. No. 6,774,741).

However, the non-uniform flat transmission line has limitations regarding signal transmission distance and a high loss of transmission signal due to noise loss caused by non-uniformity and discontinuity, which are the structural characteristics of the twisted-pair cable formed on and beneath the dielectric layer. As a result, a problem arises in that the transmission of signals is limited.

Furthermore, the non-uniform flat transmission line is mainly used only for the transmission of low frequency signals, and has a problem in that it cannot realize the same transmission characteristics as a coaxial cable, which is mainly used for high frequency signal transmission.

In addition, the non-uniform flat transmission line is problematic in that it is easily exposed to various kinds of noise because there is no electromagnetic shielding function.

Accordingly, the non-uniform flat transmission line has problems in that large transmission losses occur in a transmission band because it is exposed to noise signals, and thus the ability to eliminate common mode noise is limited, it is difficult to implement a flat transmission line having a characteristic in which a single signal is transmitted through a coaxial cable, and it does not have an electromagnetic shielding function necessary for an electrical wire transmission line.

SUMMARY OF THE INVENTION

Accordingly, the present invention has been made to solve the above problems, and an object of the present invention is to provide a flat uniform transmission line in which a strip transmission line, an insulating layer and an electromagnetic shielding layer are formed in a stacked structure, thereby making a transmission line flat and uniform, so that it can replace a conventional twisted-pair cable and a coaxial cable.

Another object of the present invention is to provide a flat uniform transmission line which has low-loss transmission characteristics in an operating frequency band because the strip lines of strip transmission lines are formed on and beneath a dielectric layer, thereby distributing impedance, the overall size of the flat uniform transmission line is minimized, and an electromagnetic shielding function can be realized through the incorporation of electromagnetic shielding layers.

In order to accomplish the above objects, the present invention provides a flat uniform transmission line having an electromagnetic shielding function, which includes a strip transmission line formed on a dielectric layer made of functional polymer material, the strip transmission line comprising a plurality of strip lines, the plurality of strip lines including a first strip line configured to be a ground line, a second strip line supplied with a single signal, and a third strip line configured to be a ground line; an insulating layer formed on the strip transmission line; and electromagnetic shielding layers respectively formed on the insulating layer and beneath the strip transmission line.

Additionally, the present invention provides a flat uniform transmission line having an electromagnetic shielding function, including a first strip transmission line formed on a dielectric layer made of functional polymer material in order to transmit signals, the first strip transmission line comprising a plurality of strip lines; a second strip transmission line formed beneath the dielectric layer in order to transmit signals, the second strip transmission line comprising a plurality of strip lines; insulating layers respectively formed on the first strip transmission line and beneath the second strip transmission line; and electromagnetic shielding layers respectively formed on the upper insulating layer and beneath the lower insulating layer.

BRIEF DESCRIPTION OF THE DRAWINGS

The above and other objects, features and other advantages of the present invention will be more clearly understood from the following detailed description taken in conjunction with the accompanying drawings, in which:

FIG. 1 is a diagram showing the construction of a conventional non-uniform flat transmission line;

FIG. 2A is a diagram showing the construction of a flat uniform transmission line according to a first embodiment of the present invention;

FIG. 2B is a sectional view of the flat uniform transmission line of FIG. 2A;

FIG. 3A is a diagram showing the construction of a flat uniform transmission line according to a second embodiment of the present invention;

FIG. 3B is a sectional view of the flat uniform transmission line of FIG. 3A;

FIG. 4A is a diagram showing the construction of a flat uniform transmission line according to a third embodiment of the present invention;

FIG. 4B is a sectional view of the flat uniform transmission line of FIG. 4A;

FIG. 5A is a diagram showing the construction of a flat uniform transmission line according to a fourth embodiment of the present invention;

FIG. 5B is a sectional view of the flat uniform transmission line of FIG. 5A;

FIG. 6A is a diagram showing the construction of a flat uniform transmission line according to a fifth embodiment of the present invention;

FIG. 6B is a sectional view of the flat uniform transmission line of FIG. 6A;

FIG. 7 is a diagram showing differential impedance characteristics based on FIG. 4A of the present invention;

FIG. 8 is a diagram showing loss and reflection coefficient characteristics based on FIG. 4A of the present invention;

FIG. 9 is a diagram showing single impedance characteristics based on FIG. 5A of the present invention; and FIG. 10 is a diagram showing insertion loss and the reflection coefficient characteristics based on FIG. 5A of the present invention.

DESCRIPTION OF THE PREFERRED EMBODIMENTS

Hereinafter, a flat uniform transmission line having an electromagnetic shielding function according to the present invention is described in detail in connection with preferred embodiments and with reference to the accompanying drawings. However, the present invention is not limited to the following embodiments.

FIG. 2A is a diagram showing the construction of a flat uniform transmission line according to a first embodiment of the present invention. FIG. 2B is a sectional view of the flat uniform transmission line of FIG. 2A. FIG. 2A shows the flat transmission line in which two strip lines 111 and 112 are formed in the same cross-section of a dielectric layer 105 so that the flat transmission line has characteristics like those of a conventional twisted-pair cable which transmits differential signals.

The flat uniform transmission line 10 according to the first embodiment of FIG. 2A includes a strip transmission line 100, configured such that the two strip lines 111 and 112 are formed on the dielectric layer 105 made of functional polymer material so as to transmit signals, an insulating layer 200 formed on the strip transmission line 100 so as to insulate the strip transmission line 100, and electromagnetic shielding layers 300 respectively formed on the insulating layer 200 and beneath the strip transmission line 100.

The strip transmission line 100 has a structure in which the two strip lines 111 and 112 are formed on the dielectric layer 105 so as to transmit signals.

The dielectric layer 105 has a constant thickness within a range of 0.1 to 5000 μm, and is made of any one material selected from the group consisting of polystyrene, polyethylene, polyester, polyimide and polypropylene, which have specific relative permittivity within a range of 1 to 10. The material is flexible, and thus the entire flat uniform transmission line has a flexible structure and flexible characteristic.

The two strip lines 111 and 112 are formed on the dielectric layer 105, and include a first strip line 111 and a second strip line 112 made of any one material selected from the group consisting of polysilicon, ceramic, carbon fiber, conductive ink and conductive paste. A plurality of strip transmission lines 100, each including the first strip line 111 and the second strip line 112 in a group, may be provided.

The first and second strip lines 111 and 112 are spaced apart from each other at a regular interval along the length of the strip transmission line 100, and are formed parallel to each other. Even if the flat uniform transmission line 10 is bent, the regular interval between the first and second strip lines 111 and 112 is kept constant along the strip transmission line 100.

Furthermore, first negative and positive differential signals are applied to the strip transmission line 100. More particularly, the first negative differential signal is applied to the first strip line 111, and the first positive differential signal is applied to the second strip line 112.

The insulating layer 200 is formed on the strip transmission line 100, and functions as a coating for insulating the first and second strip lines 111 and 112 from the outside. The insulating layer 200 may be made of any one material selected from among materials having the same characteristics as those of the dielectric layer 105.

The electromagnetic shielding layer 300 functions to block not only electromagnetic waves radiated from the strip transmission line 100 but also external noise. More particularly, the electromagnetic shielding layer 300 includes a first electromagnetic shielding layer 310 formed on the insulating layer 200 and a second electromagnetic shielding layer 320 formed beneath the strip transmission line 100.

Here, the first electromagnetic shielding layer 310 and the second electromagnetic shielding layer 320 are each formed by producing an electrically conductive polymer coating composition in such a way as to add a polymer binder, a thickener, a disperser, an adhesive, a lubricant and a solvent to electrically conductive polymer, such as polythiophene, forming a coating having a thickness within a range of 0.1 to 10 μm on the electrically conductive polymer coating composition using a gravure, offset, kiss bar, knife, Meyer bar or coma method, and then leaving the coated polymer coating composition at a temperature within a range of 50 to 250 degrees Celsius for a period within a range of about 30 seconds to 1 hour, so that a transparent electrically conductive polymer coating layer is formed on the insulating layer 200 or beneath the strip transmission line 100 while the electrically conductive polymer coating composition is volatilized, thus forming the first electromagnetic shielding layer 310 or the second electromagnetic shielding layer 320.

In another method, the first electromagnetic shielding layer 310 and the second electromagnetic shielding layer 320 are each formed by applying a solution, in which an electrically conductive polymer monomer, an oxidizer and a dopant are mixed together, to the top of the insulating layer 200 or the bottom of the strip transmission line 100, forming an electrically conductive polymer coating layer so as to heat the applied solution, and drying the electrically conductive polymer coating layer.

FIG. 3A is a diagram showing the construction of a flat uniform transmission line 10-1 according to a second embodiment of the present invention. FIG. 3B is a sectional view of the flat uniform transmission line 10-1 of FIG. 3A. As shown in the drawings, FIG. 3A shows a flat transmission line in which three strip lines 111-1 to 113-1 are formed in the same cross-section of a dielectric layer 105-1 so that it has characteristics like those of a conventional coaxial cable which transmits a single signal.

The flat uniform transmission line 10-1 according to the second embodiment of FIG. 3A has a structure in which a single signal is applied to the strip transmission line 100 of FIG. 2A. Since the elements of the flat uniform transmission line 10-1, which are the same as those of FIG. 2A, have the same characteristics, detailed descriptions thereof are omitted here.

Accordingly, as shown in FIG. 3A, a strip transmission line 100-1 is produced by forming the three strip lines 111-1 to 113-1 for transmitting signals on the dielectric layer 105-1.

The three strip lines 111-1 to 113-1 are formed on the dielectric layer 105-1, and include a first strip line 111-1, a second strip line 112-1 and a third strip line 113-1. The three strip lines 111-1 to 113-1 may be made of any one material selected from among the materials having the same characteristics as those of the two strip lines 111 and 112 of FIG. 2A.

The first to third strip lines 111-1 to 113-1 are spaced apart from one another at regular intervals along the length of the strip transmission line 100-1, and are formed parallel to one another. Even if the flat uniform transmission line 10-1 is bent, the regular intervals between the first to third strip transmission lines 111-1 to 113-1 are kept constant along the strip transmission line 100-1.

Furthermore, the strip transmission line 100-1 is supplied with a single signal. More particularly, the first strip line 111-1 is a ground line, the second strip line 112-1 is supplied with a single signal, and the third strip line 113-1 becomes a ground line, thus forming a Coplanar Waveguide (CPW) structure. Furthermore, a plurality of strip transmission lines 100-1, each including the first strip line 111-1, the second strip line 112-1 and the third strip line 113-1 in a group, may be provided.

As described above, since the remaining elements are the same and have the same characteristics as those of FIG. 2, detailed descriptions thereof are omitted here.

FIG. 4A is a diagram showing the construction of a flat uniform transmission line 40 according to a third embodiment of the present invention. FIG. 4B is a sectional view of the flat uniform transmission line 40 of FIG. 4A. FIG. 4B shows the flat uniform transmission line 40 in which strip lines are constructed in a double-layer fashion in the flat uniform transmission line 10 having characteristics like those of a prior art twisted-pair cable which transmits differential signals, as in FIG. 2A.

As shown in FIG. 4A, the flat uniform transmission line 40 includes a first strip transmission line 420, in which a plurality of strip lines is formed on a dielectric layer made of functional polymer material so as to transmit signals, a second strip transmission line 430 in which a plurality of strip lines is formed beneath the dielectric layer so as to transmit signals, insulating layers 500 which are respectively formed on the first strip transmission line 420 and beneath the second strip transmission line 430, and electromagnetic shielding layers 600 which are respectively formed on the insulating layer 500 and beneath the insulating layer 500.

The first strip transmission line 420 has a structure in which five strip lines 421~425 are formed on a dielectric layer 405 so as to transmit signals.

More particularly, the first strip transmission line 420 includes a first strip line 421, a second strip line 422, a third strip line 423, a fourth strip line 424, and a fifth strip line 425.

The second strip transmission line 430 has a structure in which five strip lines 431~435 are formed beneath the dielectric layer 405 so as to transmit signals.

More particularly, the second strip transmission line 430 includes a first strip line 431, a second strip line 432, a third strip line 433, a fourth strip line 434, and a fifth strip line 435.

Accordingly, the first and second strip transmission lines 420 and 430 are respectively formed on the dielectric layer 405 and beneath the dielectric layer 405, thereby minimizing the overall size of the flat uniform transmission line 40 and realizing broadband impedance characteristics.

Furthermore, the strip lines 421~425 or 431~435, constituting the first and second strip transmission lines 420 and 430, have a constant width and thickness. The strip lines 421~425 or 431~435 are spaced apart from one another at regular intervals along the length of the first and second strip transmission lines 420 and 430, and are formed parallel to one another. Even if the flat uniform transmission line 40 is bent, the regular intervals between the plurality of strip lines 421~425 or 431~435 are kept constant along the first or second strip transmission line 420 or 430.

The first and second strip transmission lines 420 and 430 are respectively supplied with first negative/positive differential signals and second negative/positive differential signals at the same time. More particularly, the first strip line 421 of the first strip transmission line 420 and the first strip line 431 of the second strip transmission line 430 are supplied with the first negative differential signal at the same time, the second strip line 422 of the first strip transmission line 420 and the second strip line 432 of the second strip transmission line 430 are supplied with the first positive differential signal at the same time, and the third strip line 423 of the first strip transmission line 420 and the third strip line 433 of the second strip transmission line 430 are ground lines. Furthermore, the fourth strip line 424 of the first strip transmission line 420 and the fourth strip line 434 of the second strip transmission line 430 are supplied with the second negative differential signal at the same time, and the fifth strip line 425 of the first strip transmission line 420 and the fifth strip line 435 of the second strip transmission line 430 are supplied with the second positive differential signal at the same time.

The strip lines 421~425 and 431~435, constituting the first and second strip transmission lines 420 and 430, are made of any one material selected from the group consisting of metal, polysilicon, ceramic, carbon fiber, conductive ink, and conductive paste.

The dielectric layer 405 has a constant thickness within a range of 0.1 to 5000 μm, and is made of any one material selected from the group consisting of functional polymer materials, including polystyrene, polyethylene, polyester, polyimide and polypropylene, which have specific relative permittivity within a range of 1 to 10. Since the materials have a flexible property, the entire flat uniform transmission line 40 also has a flexible structure and a flexible property.

The insulating layers 500 function as coatings for insulating the first and second strip transmission lines 420 and 430, and include a first insulating layer 510 formed on the first strip transmission line 420 and a second insulating layer 520 formed beneath the second strip line 430. The insulating layers 500 may be made of any one material selected from among materials having the same characteristics as those of the dielectric layer 405.

The electromagnetic shielding layers 600 are respectively formed on the insulating layers 500 and beneath the insulating layers 500, and function to block not only electromagnetic waves radiated from the first and second strip transmission lines 420 and 430, but also external noise.

More particularly, the electromagnetic shielding layers 600 include a first electromagnetic shielding layer 610, formed on the first insulating layer 510, and a second electromagnetic shielding layer 620, formed beneath the second insulating layer 520.

Here, the first electromagnetic shielding layer 610 and the second electromagnetic shielding layer 620 are each formed by producing an electrically conductive polymer coating composition in such a way as to add a polymer binder, a thickener, a disperser, an adhesive, a lubricant, and a solvent to an electrically conductive polymer, such as polythiophene, forming a coating having a thickness within a range of 0.1 to 10 μm on the electrically conductive polymer coating composition using a gravure, offset, kiss bar, knife, Meyer bar or coma method, and then leaving the coated polymer coating composition at a temperature within a range of 50 to 250 degrees Celsius for a period within a range of about 30 seconds to 1 hour, so that a transparent electrically conductive polymer coating layer is formed on the first insulating layer 510 or beneath the second insulating layer 520 while the electrically conductive polymer coating composition is volatilized, and forms the first electromagnetic shielding layer 610 or the second electromagnetic shielding layer 620.

In another method, the first electromagnetic shielding layer 610 and the second electromagnetic shielding layer 620 are each formed by applying a solution, in which an electrically conductive polymer monomer, an oxidizer and a dopant are mixed together, to the top of the first insulating layer 510 or the bottom of the second insulating layer 520, forming an electrically conductive polymer coating layer in such a way as to heat the coated solution, and drying the electrically conductive polymer coating layer.

More particularly, in order to promote an understanding of the present invention, detailed specifications of respective elements of FIG. 4A will be described below.

The dielectric layer 405 is polyethylene functional polymer material having a relative permittivity of 8, a thickness of 0.05 mm and a width of 50 mm.

The strip lines 421~425 and 431~435, constituting the first and second strip transmission lines 420 and 430, are made of copper (Cu), and have a thickness of 0.01 mm and a width of 8 mm. The regular intervals between the strip lines 421~-425 and 431~435 are 1 mm.

The insulating layer 500 is polyethylene functional polymer material having a thickness of 0.05 mm and a width of 50 mm.

The electromagnetic shielding layer 600 is formed of an ultra-thin film having a thickness equal to or less than 5 μm, and is made of an electrically conductive polymer material having a surface resistance within a range of 0.01 to 10E1 Ω/cm.

Here, the above-described specifications of the flat uniform transmission line are set forth to promote an understanding of the present invention through the embodiments, and the present invention is not limited to the above-described specifications. The characteristics of the flat uniform transmission lines of FIGS. 7 and 8, which will be described later, are characteristics that were analyzed and measured using the flat uniform transmission line 40 designed according to the above-described specifications described with reference to FIG. 4A.

FIG. 5A is a diagram showing the construction of a flat uniform transmission line 40-1 according to a fourth embodiment of the present invention. FIG. 5B is a sectional view of the flat uniform transmission line 40-1 of FIG. 5A. FIG. 5B shows the flat uniform transmission line 40-1 in which strip lines are constructed in a double-layer fashion in the flat uniform transmission line 10-1 having characteristics like those of a prior art coaxial cable which transmits a single signal, as in FIG. 3A.

The flat uniform transmission line 40-1 according to the fourth embodiment of FIG. 5A has a structure in which two single signals are applied to the first and second strip transmission lines 420 and 430 of FIG. 4A at the same time. Since the elements of the flat uniform transmission line 40-1, which are the same as those of FIG. 4A, have the same characteristics, detailed descriptions thereof are omitted here.

As shown in FIG. 5A, first and second strip transmission lines 420-1 and 420-2 include ten strip lines 421-1~425-1 and 431-1~435-1 for transmitting signals, which are formed on or beneath a dielectric layer 405-1.

The first strip transmission line 420-1 is formed on the dielectric layer 405-1, and includes a first strip line 421-1, a second strip line 422-1, a third strip line 423-1, a fourth strip line 424-1 and a fifth strip line 425-1.

The second strip transmission line 430-1 is formed beneath the dielectric layer 405-1, and includes a first strip line 431-1, a second strip line 432-1, a third strip line 433-1, a fourth strip line 434-1 and a fifth strip line 435-1.

Accordingly, the first and second strip transmission lines 420-1 and 430-1 are respectively formed on the dielectric layer 405-1 and beneath the dielectric layer 405-1, thereby minimizing the overall size of the flat uniform transmission line 40-1 and realizing broadband impedance characteristics.

Furthermore, the plurality of strip lines 421-1~425-1 and 431-1~435-1, constituting the first and second strip transmission lines 420-1 and 430-1, have a constant width and thickness. The strip lines 421-1~425-1 and 431-1~435-1 are spaced apart from one another at regular intervals along the length of the first and second strip transmission lines 420-1 and 430-1, and are formed parallel to one another. Even if the flat uniform transmission line 40-1 is bent, the regular intervals between the plurality of strip lines 421-1~425-1 and 431-1~435-1 are kept constant along the first and second strip transmission lines 420-1 and 430-1.

The first and second strip transmission lines 420-1 and 430-1 are respectively supplied with a first single signal and a second single signal at the same time. More particularly, the first strip line 421-1 of the first strip transmission line 420-1 and the first strip line 431-1 of the second strip transmission line 430-1 are ground lines, the second strip line 422-1 of the first strip transmission line 420-1 and the second strip line 432-1 of the second strip transmission line 430-1 are supplied with the first single signal at the same time, and the third strip line 423-1 of the first strip transmission line 420-1 and the third strip line 433-1 of the second strip transmission line 430-1 are ground lines. Furthermore, the fourth strip line 424-1 of the first strip transmission line 420-1 and the fourth strip line 434-1 of the second strip transmission line 430-1 are supplied with the second single signal at the same time, and the fifth strip line 425-1 of the first strip transmission line 420-1 and the fifth strip line 435-1 of the second strip transmission line 430-1 are ground lines.

The first and second strip transmission lines 420-1 and 430-1 may be made of any one material selected from among materials having the same characteristics as those of the first and second strip transmission lines 420 and 430 of FIG. 4A.

As described above, since the remaining elements are the same and have the same characteristics as those of FIG. 4A, detailed descriptions thereof are omitted here.

More particularly, in order to promote an understanding of the present invention, detailed specifications of respective elements of FIG. 5A will be described below.

The dielectric layer 405-1 is a polyethylene functional polymer material having a relative permittivity of 8, a thickness of 0.05 mm and a width of 50 mm.

The strip lines 421-1~425-1 and 431-1~435-1, which constitute the first and second strip transmission lines 420-1 and 430-1, are made of copper (Cu), and have a thickness of 0.01 mm and a width of 8 mm. The interval between the strip lines 421-1~425-1 and 431-1~435-1 is 1 mm.

The insulating layer 500-1 is a polyethylene functional polymer material having a thickness of 0.05 mm and a width of 50 mm.

The electromagnetic shielding layer 600-1 is formed of an ultra-thin film having a thickness equal to or less than 5 μm, and is made of an electrically conductive polymer material having a surface resistance within a range of 0.01 to 10E1 Ω/cm.

Here, the above-described specifications of the flat uniform transmission line are set forth to promote an understanding of the present invention through the embodiments, and the present invention is not limited to the above-described specifications. The characteristics of the flat uniform transmission lines of FIGS. 9 and 10, which will be described later, are characteristics that were analyzed and measured using the flat uniform transmission line 40-1, which is designed according to the above-described specifications described with reference to FIG. 5A.

FIG. 6A is a diagram showing the construction of a flat uniform transmission line 40-2 according to a fifth embodiment of the present invention. FIG. 6B is a sectional view of the flat uniform transmission line 40-2 according to FIG. 6A.

The flat uniform transmission line 40-2 has a structure in which three single signals are applied to the first and second strip transmission lines 420-1 and 430-1 shown in FIG. 5A. Since the elements of the flat uniform transmission line 40-2 that are the same as those of FIG. 5A have the same characteristics, detailed descriptions thereof are omitted here.

As shown in FIG. 6A, the flat uniform transmission line 40-2 includes a first strip transmission line 420-2 formed on a dielectric layer 405-2 and a second strip transmission line 430-2 formed beneath the dielectric layer 405-2.

More particularly, the first strip transmission line 420-2 includes a first strip line 421-2, a second strip line 422-2, a third strip line 423-2, a fourth strip line 424-2 and a fifth strip line 425-2. The second strip transmission line 430-2 includes a first strip line 431-2, a second strip line 432-2, a third strip line 433-2, a fourth strip line 434-2 and a fifth strip line 435-2.

Furthermore, the first and second strip transmission lines 420-2 and 430-2 are respectively formed on the dielectric layer 405-2 and beneath the dielectric layer 405-2, thereby minimizing the overall size of the flat uniform transmission line 40-2 and realizing broadband impedance characteristics.

In addition, the strip lines 421-2 - 425-2 and 431-2 - 435-2, which constitute the first and second strip transmission lines 420-2 and 430-2, have a constant width and thickness. The strip lines 421-2~425-2 and 431-2~435-2 are spaced apart from one another at regular intervals along the length of the first and second strip transmission lines 420-2 and 430-2, and are formed parallel to one another. Even if the flat uniform transmission line 40-2 is bent, the regular intervals between the strip lines 421-2~425-2 and 431-2~435-2 are kept constant along the first and second strip transmission lines 420-2 and 430-2.

The first and second strip transmission lines 420-2 and 430-2 are supplied with a first single signal, a second single signal and a third single signal at the same time. More particularly, the first strip line 421-2 of the first strip transmission line 420-2 and the first strip line 431-2 of the second strip transmission line 430-2 are supplied with the first single signal at the same time, the second strip line 422-2 of the first strip transmission line 420-2 and the second strip line 432-2 of the second strip transmission line 430-2 are ground lines, and the third strip line 423-2 of the first strip transmission line 420-2 and the third strip line 433-2 of the second strip transmission line 430-2 are supplied with the second single signal at the same time. Furthermore, the fourth strip line 424-2 of the first strip transmission line 420-2 and the fourth strip line 434-2 of the second strip transmission line 430-2 are ground lines, and the fifth strip line 425-2 of the first strip transmission line 420-2 and the fifth strip line 435-2 of the second strip transmission line 430-2 are supplied with the third single signal at the same time.

The first and second strip transmission lines 420-2 and 430-2 may be made of any one material selected from among the materials having the same characteristics as those of the first and second strip transmission lines 420-1 and 430-1 of FIG. 5A.

FIG. 7 is a diagram showing differential impedance characteristics based on FIG. 4A of the present invention. As described above in conjunction with the third embodiment, both FIGS. 7 and 8 are diagrams showing characteristics that were analyzed and measured using the flat uniform transmission line 40, designed based on the detailed specifications of respective elements of FIG. 4A.

The results of the measurements of impedance of the flat uniform transmission line 40 according to the third embodiment of FIG. 4A in a frequency band of 0 to 1 GHz are shown in FIG. 7.

As can be seen from FIG. 7, the impedance of the flat uniform transmission line 40 according to the third embodiment falls within 10% (that is, an impedance error range of a 100 Ω over a differential impedance transmission line). Accordingly, the flat uniform transmission line according to the present invention can realize the same broadband impedance characteristics, which cannot be realized in a high frequency band.

FIG. 8 is a diagram showing insertion loss and the reflection coefficient characteristics based on FIG. 4A of the present invention. FIG. 8 shows the results of the measurements of the reflection coefficients and insertion losses of the flat uniform transmission line 40 according to the third embodiment of FIG. 4A in a frequency band of 0 to 1 GHz.

Here, the insertion loss is 0.02 dB at a frequency of 100 MHz when the length of the first, second, fourth and fifth strip lines 421, 422, 424, 425, 431, 432, 434 and 435 is 200 mm. Since the insertion loss is defined as 22 dB/100 m at 100 MHz in the transmission specifications of a UTP cable and the insertion loss is about 10 dB when the length of the flat uniform transmission line of the present invention is 100 m, it can be seen that the insertion loss is improved significantly.

FIG. 9 is a diagram showing single impedance characteristics based on FIG. 5A of the present invention. Both FIGS. 9 and 10 are diagrams showing characteristics that were analyzed and measured using the flat uniform transmission line 40-1, designed based on the detailed specifications of respective elements of FIG. 5A.

The results of the measurements of the impedance of the flat uniform transmission line 40-1 according to the fourth embodiment of FIG. 5A at a frequency band of 0 to 1 GHz are shown in FIG. 9.

Therefore, in the case of a 75 Ω coaxial cable for transmitting signals at frequencies within a range of 54 MHz to 800 MHz, which is the frequency band within which an HDTV is generally operated, transmission characteristics can be secured when the cable has uniform impedance characteristics over the entire band. Accordingly, the flat uniform transmission line according to the present invention can realize the same broadband impedance characteristics.

FIG. 10 is a diagram showing insertion loss and the reflection coefficient characteristics based on FIG. 5A of the present invention. The results of the measurements of the reflection coefficient and insertion loss of the flat uniform transmission line 40-1 according to the fourth embodiment of FIG. 5A in a frequency band ranging from 0 to 1 GHz are shown in FIG. 10.

Here, in the case of a 75 Ω coaxial cable for transmitting signals at frequencies within a range of 54 MHz to 800 MHz, which is the frequency band within which an HDTV is generally operated, the insertion loss per 100 m is 25 dB or lower, and the reflection coefficient is 15 dB or higher in the case of a general L-4CFB cable, even though they vary depending on the type of coaxial cable. Accordingly, the flat uniform transmission line of the present invention has excellent characteristics when the length thereof is 100 m in that the insertion loss is 25 dB or lower and the reflection coefficient is about 15 dB.

The present invention provides a flat uniform transmission line having an electromagnetic shielding function, which satisfies both the transmission characteristics of a coaxial cable, used in a high frequency band, and the characteristics of a twisted-pair cable, used in a low frequency band, and has excellent broadband impedance characteristics.

Furthermore, the present invention has advantages in that the overall size of a flat uniform transmission line can be reduced through strip lines formed in a double-layer fashion, and electromagnetic waves, radiated from the flat uniform transmission line, as well as external noise can be blocked because electromagnetic shielding layers are formed.

Although the preferred embodiments of the present invention have been disclosed for illustrative purposes, those skilled in the art will appreciate that various modifications, additions and substitutions are possible without departing from the scope and spirit of the present invention as disclosed in the accompanying claims.

What is claimed is:

1. A flat uniform transmission line having an electromagnetic shielding function, comprising:
   a first strip transmission line formed on a dielectric layer made of functional polymer material in order to transmit signals, the first strip transmission line comprising a plurality of strip lines;
   a second strip transmission line formed beneath the dielectric layer in order to transmit the signals duplicately and simultaneously, the second strip transmission line comprising a plurality of strip lines, the second strip transmission line duplicated with the first strip transmission line;
   insulating layers respectively formed on the first strip transmission line and beneath the second strip transmission line; and
   electromagnetic shielding layers respectively formed on the upper insulating layer and beneath the lower insulating layer,
   wherein the entire flat uniform transmission line has a flexible structure and a flexible property, and each of the first strip transmission line and the second strip transmission line has a straight line geometry.

2. The flat uniform transmission line as set forth in claim 1, wherein the first strip transmission line and the second strip transmission line are simultaneously supplied with differential signals and ground signal.

3. The flat uniform transmission line as set forth in claim 2, wherein the first strip transmission line comprises a first strip line supplied with a first negative differential signal, a second strip line supplied with a first positive differential signal, a third strip line configured to be a ground line, a fourth strip line supplied with a second negative differential signal, and a fifth strip line supplied with a second positive differential signal.

4. The flat uniform transmission line as set forth in claim 3, wherein the first to fifth strip lines, constituting the first strip transmission line, are spaced apart from one another at regular intervals that are kept constant along a length of the first strip transmission line.

5. The flat uniform transmission line as set forth in claim 3, wherein the second strip transmission line comprises a first strip line supplied with a first negative differential signal, a second strip line supplied with a first positive differential signal, a third strip line configured to be a ground line, a fourth strip line supplied with a second negative differential signal, and a fifth strip line supplied with a second positive differential signal.

6. The flat uniform transmission line as set forth in claim 5, wherein the first to fifth strip lines, constituting the second strip transmission line, are spaced apart from one another at regular intervals that are kept constant along a length of the second strip transmission line.

7. The flat uniform transmission line as set forth in claim 1, wherein the insulating layer comprises a first insulating layer formed on the first strip transmission line and a second insulating layer formed beneath the second strip transmission line.

8. The flat uniform transmission line as set forth in claim 1, wherein the electromagnetic shielding layers comprise a first electromagnetic shielding layer formed on the first insulating layer and a second electromagnetic shielding layer formed beneath the second insulating layer.

9. A flat uniform transmission line having an electromagnetic shielding function, comprising:
   a first strip transmission line formed on a dielectric layer made of functional polymer material in order to transmit signals, the first strip transmission line comprising a first strip line supplied with a first negative differential signal, a second strip line supplied with a first positive differential signal, a third strip line configured to be a ground line, a fourth strip line supplied with a second negative differential signal, and a fifth strip line supplied with a second positive differential signal;
   a second strip transmission line formed beneath the dielectric layer in order to transmit the signals simultaneously and duplicately with the first strip transmission line, the second strip line comprising a first strip line supplied with the first negative differential signal, a second strip line supplied with the first positive differential signal, a third strip line configured to be a ground line, a fourth strip line supplied with the second negative differential signal, and a fifth strip line supplied with the second positive differential signal;
   a first insulating layer formed on the first strip transmission line;
   a second insulating layer formed beneath the second strip transmission line; and
   electromagnetic shielding layers respectively formed on the first insulating layer and beneath the second insulating layer,
   wherein the entire flat uniform transmission line has a flexible structure and a flexible property, and each of the first strip transmission line and the second strip transmission line has a straight line geometry.

10. A flat uniform transmission line having an electromagnetic shielding function, comprising:
    a first strip transmission line formed on a dielectric layer made of functional polymer material in order to transmit signals, the first strip transmission line comprising a first strip line supplied with a first negative differential signal, a second strip line supplied with a first positive differential signal, a third strip line configured to be a ground line, a fourth strip line supplied with a second negative differential signal, and a fifth strip line supplied with a second positive differential signal;
    a second strip transmission line formed beneath the dielectric layer in order to transmit the signals simultaneously and duplicately with the first strip transmission line, the second strip transmission line comprising a first strip line supplied with the first negative differential signal, a second strip line supplied with the first positive differential signal, a third strip line configured to be a ground line. a fourth strip line supplied with the second negative differential signal, and a fifth strip line supplied with the second positive differential signal;
    insulating layers respectively formed on the first strip transmission line and beneath the second strip transmission line;
    a first electromagnetic shielding layer formed on the upper insulating layer; and
    a second electromagnetic shielding layer formed beneath the lower insulating layer,
    wherein the entire flat uniform transmission line has a flexible structure and a flexible property, and each of the first strip transmission line and the second strip transmission line has a straight line geometry.

11. A flat uniform transmission line having an electromagnetic shielding function, comprising:
- a first strip transmission line formed on a dielectric layer made of functional polymer material in order to transmit signals, the first strip transmission line comprising a first strip line supplied with a first negative differential signal, a second strip line supplied with a first positive differential signal, a third strip line configured to be a ground line, a fourth strip line supplied with a second negative differential signal, and a fifth strip line supplied with a second positive differential signal;
- a second strip transmission line formed beneath the dielectric layer in order to transmit the signals simultaneously and duplicately with the first strip transmission line, the second strip transmission line comprising a first strip line supplied with the first negative differential signal, a second strip line supplied with the first positive differential signal, a third strip line configured to be a ground line, a fourth strip line supplied with the second negative differential signal, and a fifth strip line supplied with the second positive differential signal;
- a first insulating layer formed on the first strip transmission line;
- a second insulating layer formed beneath the second strip transmission line;
- a first electromagnetic shielding layer formed on the first insulating layer; and
- a second electromagnetic shielding layer formed beneath the second insulating layer,
- wherein the entire flat uniform transmission line has a flexible structure and a flexible property, and each of the first strip transmission line and the second strip transmission line has a straight line geometry.

* * * * *